(12) United States Patent
Eriksson et al.

(10) Patent No.: US 8,965,013 B2
(45) Date of Patent: Feb. 24, 2015

(54) ECHO CANCELLATION

(75) Inventors: Joakim Eriksson, Lund (SE); Jonny Strandh, Höör (SE)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 502 days.

(21) Appl. No.: 13/410,677

(22) Filed: Mar. 2, 2012

(65) Prior Publication Data

US 2013/0230183 A1    Sep. 5, 2013

(51) Int. Cl.
*H04R 25/00* (2006.01)
*H04R 3/00* (2006.01)
*H04R 9/08* (2006.01)

(52) U.S. Cl.
USPC ........... 381/174; 381/175; 381/111; 381/113; 381/355

(58) Field of Classification Search
USPC ............. 381/174, 175, 111, 113, 122, 66, 93, 381/95, 355, 369, 375, 168, 150
See application file for complete search history.

(56) References Cited

U.S. PATENT DOCUMENTS

| | | | |
|---|---|---|---|
| 4,414,433 A | 11/1983 | Horie et al. | |
| 7,756,279 B2 * | 7/2010 | Deruginsky et al. | 381/95 |
| 8,644,529 B2 * | 2/2014 | Ejaz et al. | 381/174 |
| 2008/0002841 A1 * | 1/2008 | Baker et al. | 381/113 |

FOREIGN PATENT DOCUMENTS

EP    2270979 A1    1/2001

OTHER PUBLICATIONS

European Patent Office; Extended European Search Report; Dec. 11, 2014; issued in European Patent Application No. 13153440.6.

* cited by examiner

*Primary Examiner* — Vivian Chin
*Assistant Examiner* — David Ton
(74) *Attorney, Agent, or Firm* — Sreenivas Vedantam; Moore & Van Allen PLLC

(57) ABSTRACT

The invention is directed to echo cancellation for a microphone system. An exemplary microphone system comprises a first transistor, wherein a gate terminal of the first transistor is connected to a ground terminal via a microphone electret element, the microphone electret element being associated with a capacitance and a voltage, the microphone electret element reverse biasing the first transistor; and a second transistor in parallel with the first transistor, wherein a gate terminal of the second transistor is connected to the ground terminal via a capacitor, the capacitance of the capacitor being selected to suppress at least a portion of a common mode signal, and wherein the gate terminal of the second transistor is not connected to the microphone electret element. The common mode signal comprises the echo, which may be the output of a speaker system that is received as input to the microphone system.

20 Claims, 9 Drawing Sheets

ECHO CANCELLATION

BACKGROUND

Echo arises when audio from a speaker is picked by a microphone situated nearby. When a speaker and a microphone are being used for telecommunication, the echo can be heard by a far-end talker. A near-end talker may be a user of the speaker and the microphone, while a far-end talker is anyone who uses a communication device (e.g., a portable mobile communication device) to communicate with the user of the speaker and microphone. If the echo is not reduced, the far-end talker encounters a difficult and an uncomfortable listening experience, especially because of the delay after which the echo can be heard.

The echo arises when the microphone and the speaker are part of the same device or when the microphone and the speaker are part of different devices but are situated closed to each other. Echo arises even when the microphone and speaker are not situated close to each other, but the audio output of the speaker is received by or is picked up by the microphone. Examples of echo may be found when the follow types of systems are used: a hands-free automobile telecommunication system, a mobile communication device being used in hands-free or speaker mode, a meeting-room speakerphone, a system that uses ceiling speakers or wall speakers along with microphones on a table or along the ground in a room, physical coupling in a communication device (when vibrations of a speaker transfer to the microphone via the casing or housing of the communication device), etc.

In each of these examples, audio from a speaker is received at a microphone. Sometimes, the audio enters the microphone unaltered. This may be referred to as direct acoustic path echo. Sometimes, the audio is altered by the surrounding (e.g., the ambient space) prior to entering the microphone. These alterations include certain frequencies being absorbed by objects (e.g., soft furnishings) or surfaces in the path between the speaker and the microphone. These alterations also include reflections associated with objects, surface, or boundaries encountered in the path between the speaker and the microphone. Sometimes, the path may be an intra-device path, e.g., the path between the speaker and microphone that goes through the device in which the speaker and microphone are located. Sometimes the path may be a path via the housing of the device. Additionally or alternatively, the path may be a path that is situated outside the device regardless of whether or not the speaker and microphone are located in the same device. Therefore, even when the speaker and microphone are located in the same device, audio from the speaker may enter the microphone after traveling on a path situated outside the device.

Therefore, what is needed is a system for echo cancellation, i.e., a system that substantially reduces the echo encountered by the far-end talker.

BRIEF SUMMARY

Embodiments of the invention are directed to systems, methods and computer program products for performing echo cancellation or reduction. In some embodiments, an exemplary microphone system comprises a microphone circuit comprising: a first transistor, wherein a gate terminal of the first transistor is connected to a ground terminal via a microphone electret element, the microphone electret element being associated with a capacitance and a voltage, the microphone electret element reverse biasing the first transistor; and a second transistor in parallel with the first transistor, wherein a gate terminal of the second transistor is connected to the ground terminal via a capacitor, the capacitance of the capacitor being selected to suppress or cancel at least a portion of a common mode signal, and wherein the gate terminal of the second transistor is not connected to the microphone electret element.

In some embodiments, the common mode signal may be obtained by measuring the voltage between a drain terminal of the first transistor and the ground terminal. Therefore, in some embodiments, the common mode signal may be at least a part (or an entire part) of the voltage measured at the drain terminal of the first transistor.

In some embodiments, the capacitance of the second transistor is selected based at least partially on a bias voltage associated with at least one of the first transistor or the second transistor.

In some embodiments, the capacitance of the second transistor is selected based at least partially on the voltage associated with the microphone electret element.

In some embodiments, the capacitance of the second transistor is selected based at least partially on at least one characteristic associated with at least one of the first transistor, the second transistor, or the microphone electret element.

In some embodiments, an exemplary method for suppressing or canceling echo in a microphone system is provided. The method comprises providing a first transistor, wherein a gate terminal of the first transistor is connected to a ground terminal via a microphone electret element, the microphone electret element being associated with a capacitance and a voltage, the microphone electret element reverse biasing the first transistor; providing a second transistor in parallel with the first transistor, wherein a gate terminal of the second transistor is connected to the ground terminal via a capacitor, and wherein the gate terminal of the second transistor is not connected to the microphone electret element; and determining a capacitance for the capacitor to substantially optimize an amount of suppression of a common mode signal, the common mode signal comprising an echo. In some embodiments, optimizing an amount of suppression refers to producing a substantial or maximum amount of suppression of the echo. In some embodiments, the common mode signal is at least a part of a signal (e.g., a voltage signal) between a drain terminal of the first transistor and the ground terminal. In other embodiments, the common mode signal may be a current signal, where the current signal is associated with the current flowing between the drain and source terminals of the first transistor.

In some embodiments, an exemplary microphone system is provided. comprises a housing that at least partially encloses a cavity and an electrode; a moveable membrane attached to the housing and configured to receive sound waves, the membrane and the electrode forming a capacitive electret element, the sound waves causing the movable membrane to move thereby resulting in a change in the capacitive electret element's capacitance, the sound waves comprising sound waves output by a speaker system; and a single semiconductor package comprising: a first transistor connected to the capacitive electret element such that a change in the capacitive electret element's capacitance changes an amount of current flowing through the first transistor; and a second transistor not connected to the capacitive electret element and configured to produce a reference voltage that is substantially constant both when the membrane receives sound waves and when the membrane does not receive sound waves.

In some embodiments, the microphone system is located in a portable mobile communication device.

In some embodiments, the sound waves output by the speaker system that are received at the membrane comprise an echo.

In some embodiments, an amount of current that flows through the first transistor is substantially similar to an amount of current that flows through the second transistor.

In some embodiments, the reference voltage is substantially equal to a voltage across the first transistor.

In some embodiments, the first transistor is reverse biased by the capacitive electret element.

In some embodiments, the second transistor is biased (e.g., forward or reverse biased) such that a substantially similar amount of current flows through both the first transistor and the second transistor.

In some embodiments, the first transistor and the second transistor are in a parallel configuration.

In some embodiments, the first transistor converts a higher impedance to a lower impedance.

In some embodiments, the microphone system of claim 1 further comprises an audio amplifier that receives output from the first transistor as a first input and receives output from the second transistor as a second input.

In some embodiments, the sound waves comprise sound waves associated with a user's speech that are received at the membrane (e.g., sound waves associated with a user speaking in close proximity to the membrane).

In some embodiments, the sound waves received by the membrane comprise at least one of a delayed or filtered version of the sound waves output by the speaker system.

In some embodiments, the speaker system and the microphone system are part of a single device.

In some embodiments, the sound waves output by the speaker system comprise sound waves associated with a far-end talker, wherein the far-end talker uses a communication device (e.g., a portable mobile communication device) to communicate with a user of the microphone system.

In some embodiments, the microphone system, using output associated with the second transistor, creates or generates at least one of a delayed or filtered version of the sound waves output by the speaker system.

In some embodiments, the microphone system, using output associated with the second transistor, reduces a magnitude of the sound waves output by the speaker system.

In some embodiments, the microphone system increases a magnitude of sound waves associated with a user's speech that are received at the membrane (e.g., sound waves associated with a user speaking in close proximity to the membrane).

In some embodiments, a method is provided for reducing echo associated with a microphone system. In some embodiments, the method comprises providing a microphone system comprising: a housing that at least partially encloses a cavity and an electrode; a moveable membrane configured to receive sound waves, the membrane and the electrode forming a capacitive electret element, the sound waves causing the movable membrane to move thereby resulting in a change in the capacitive electret element's capacitance; and a single semiconductor package comprising a first transistor connected to the capacitive electret element such that a change in the capacitive electret element's capacitance changes an amount of current flowing through the first transistor, and a second transistor not connected to the capacitive electret element.

In some embodiments, the method further comprises producing, by the second transistor, a reference voltage that is substantially constant both when the membrane receives sound waves and when the membrane does not receive sound waves, the sound waves comprising sound waves output by a speaker system, the echo comprising the sound waves output by the speaker system that are received at the membrane.

In some embodiments, the method further comprises reducing, by the microphone system and using an output associated with the second transistor, a magnitude of the sound waves output by the speaker system that are received by the membrane.

In some embodiments, a computer program product for reducing echo associated with a microphone system is provided. An exemplary computer program product comprises a non-transitory computer readable medium comprising code configured to cause a computer to: configure the microphone system to process sound waves, the microphone system comprising a housing that at least partially encloses a cavity and an electrode, and further comprising a moveable membrane, which is attached to a microphone housing, to receive sound waves, the membrane and the electrode forming a capacitive electret element, the sound waves causing the movable membrane to move thereby resulting in a change in the capacitive electret element's capacitance, the microphone system further comprising a single semiconductor package comprising a first transistor connected to the capacitive electret element such that a change in the capacitive electret element's capacitance changes an amount of current flowing through the first transistor, and a second transistor not connected to the capacitive electret element.

In some embodiments, the code further causes a computer to configure the second transistor to produce a reference voltage that is substantially constant both when the membrane receives sound waves and when the membrane does not receive sound waves, wherein the sound waves comprise sound waves output by a speaker system.

In some embodiments, the code further causes a computer to configure the microphone system to reduce, using an output associated with the second transistor, a magnitude of the sound waves output by the speaker system that are received by the membrane.

In some embodiments, a semiconductor package (e.g., a semiconductor package that packages components in a single housing) is provided that comprises a first transistor; at least one pin associated with the first transistor, wherein the voltage across the first transistor changes based at least partially on a connection to the at least one pin associated with the first transistor; a second transistor; and at least one pin to enable connection to the second transistor, wherein the voltage across the second transistor does not change based at least partially on a connection to the at least one pin associated with the second transistor. In some embodiments of the semiconductor package, the voltage across the second transistor is configured to be substantially equal to the voltage across the first transistor.

BRIEF DESCRIPTION OF THE DRAWINGS

Figure 1:
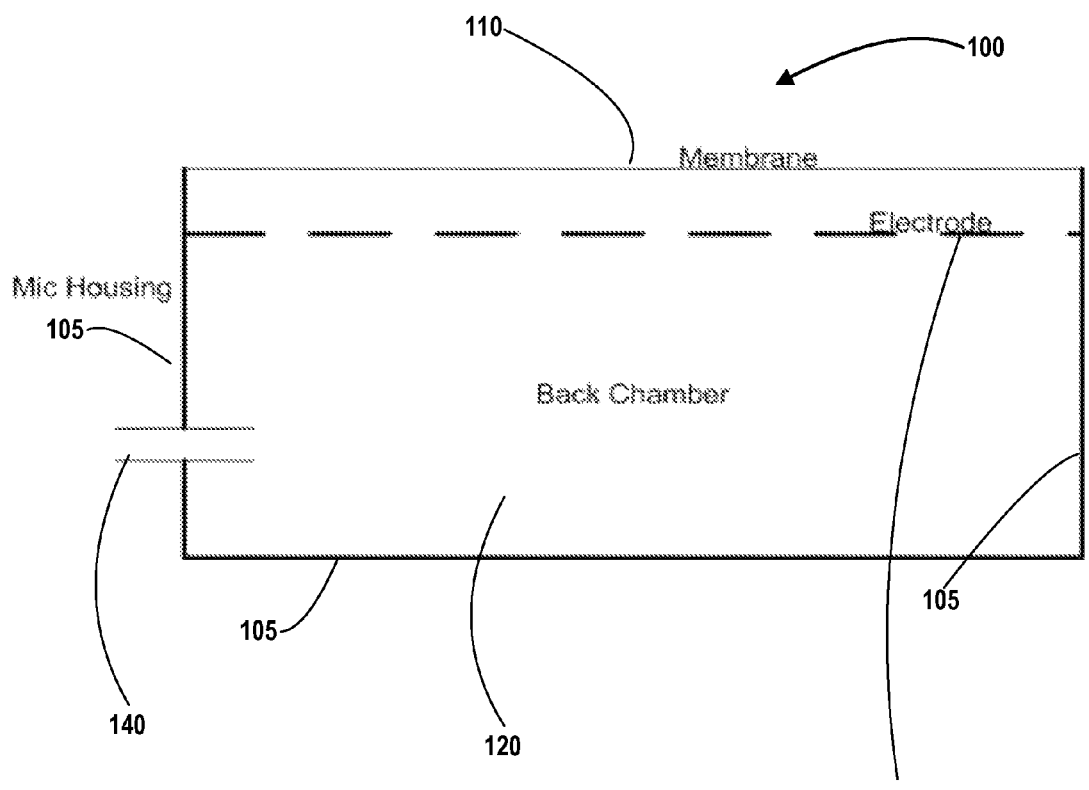
Figure 2:
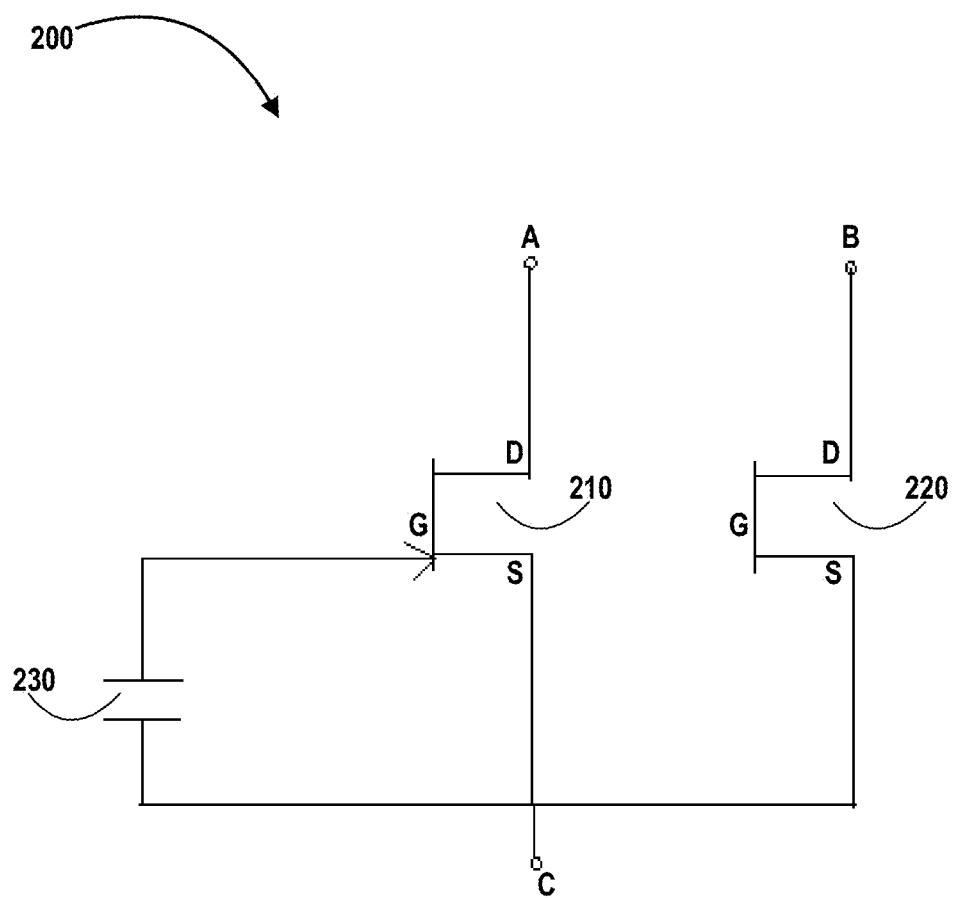
Figure 3:
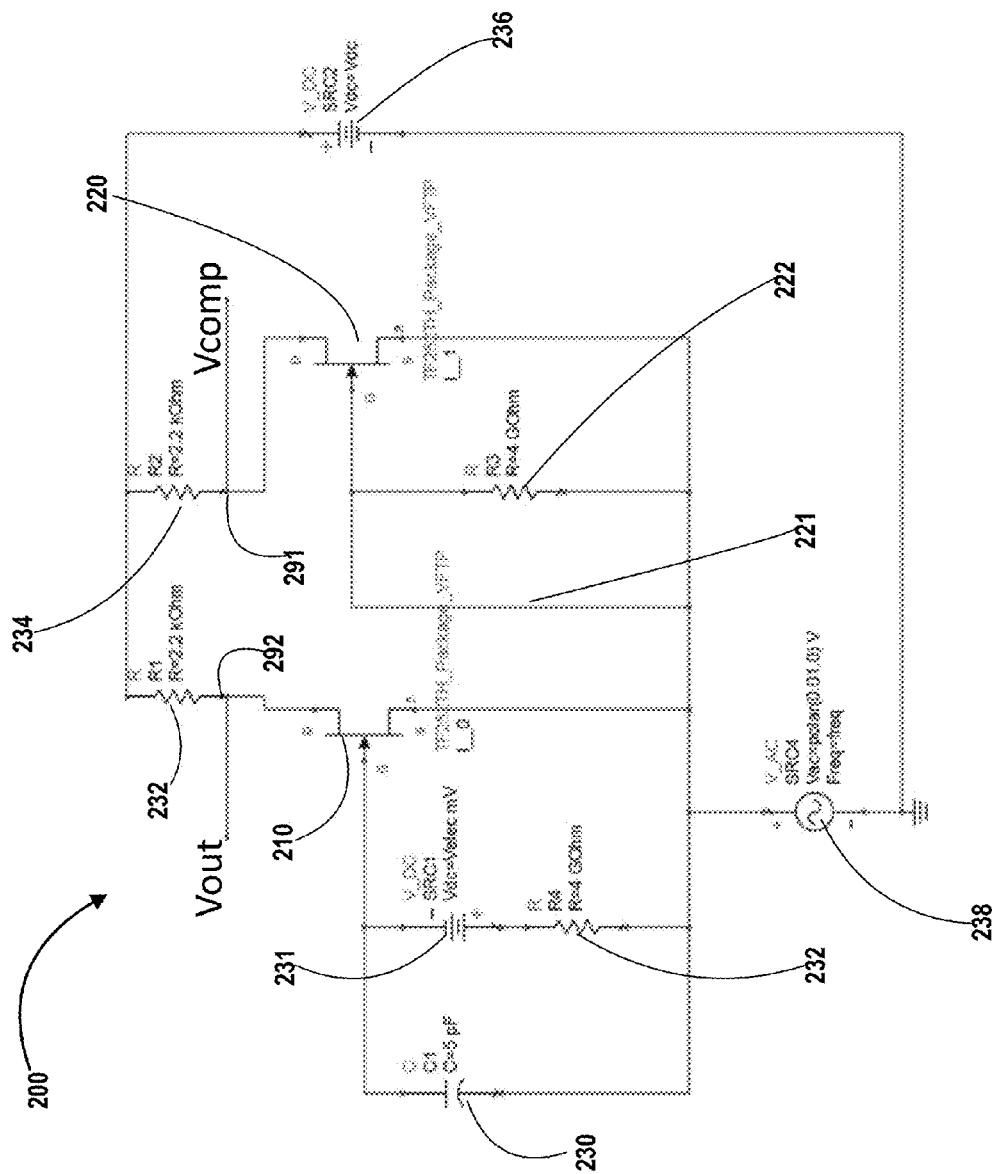
Figure 4:
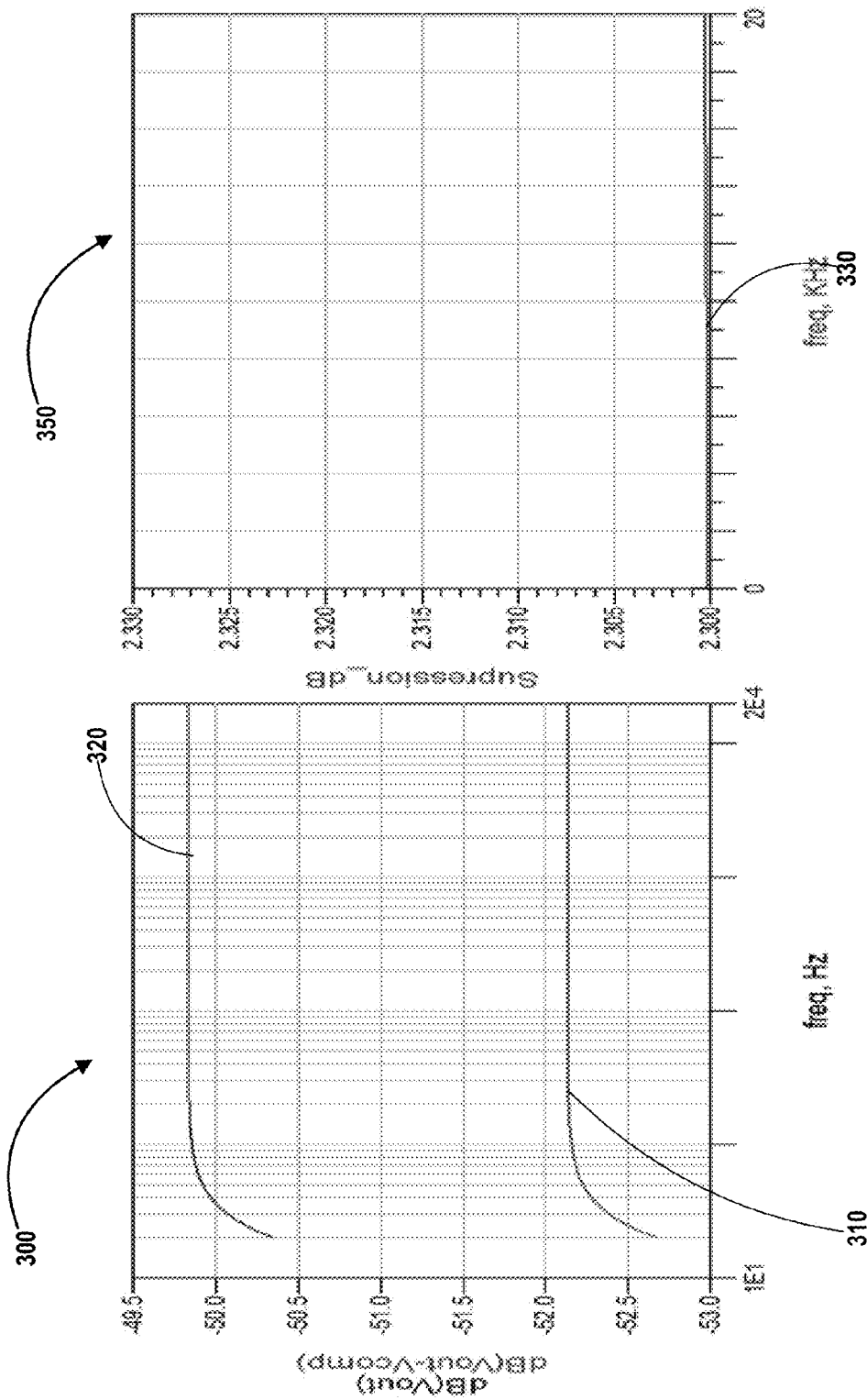
Figure 5:
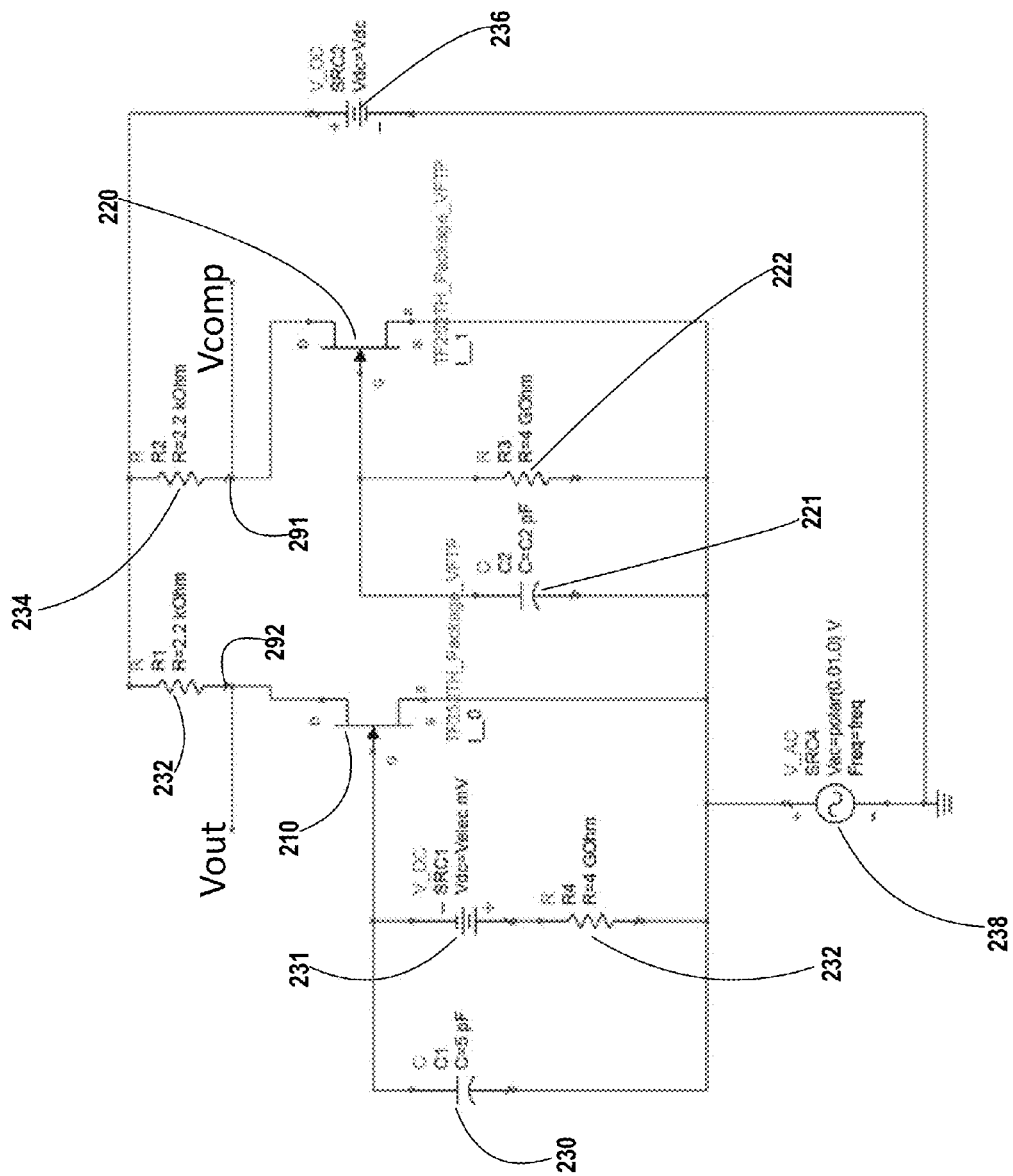
Figure 6:
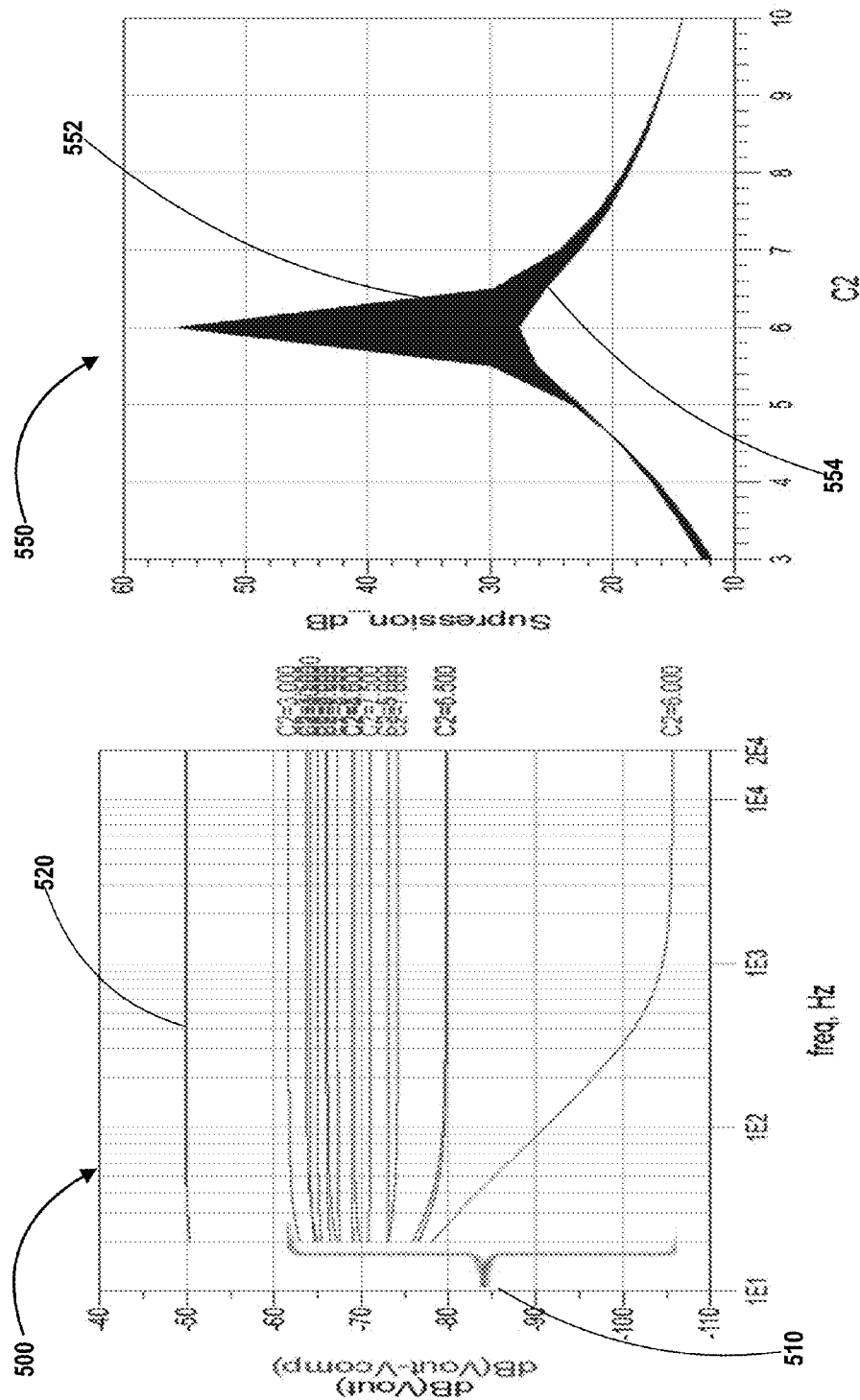
Figure 7:
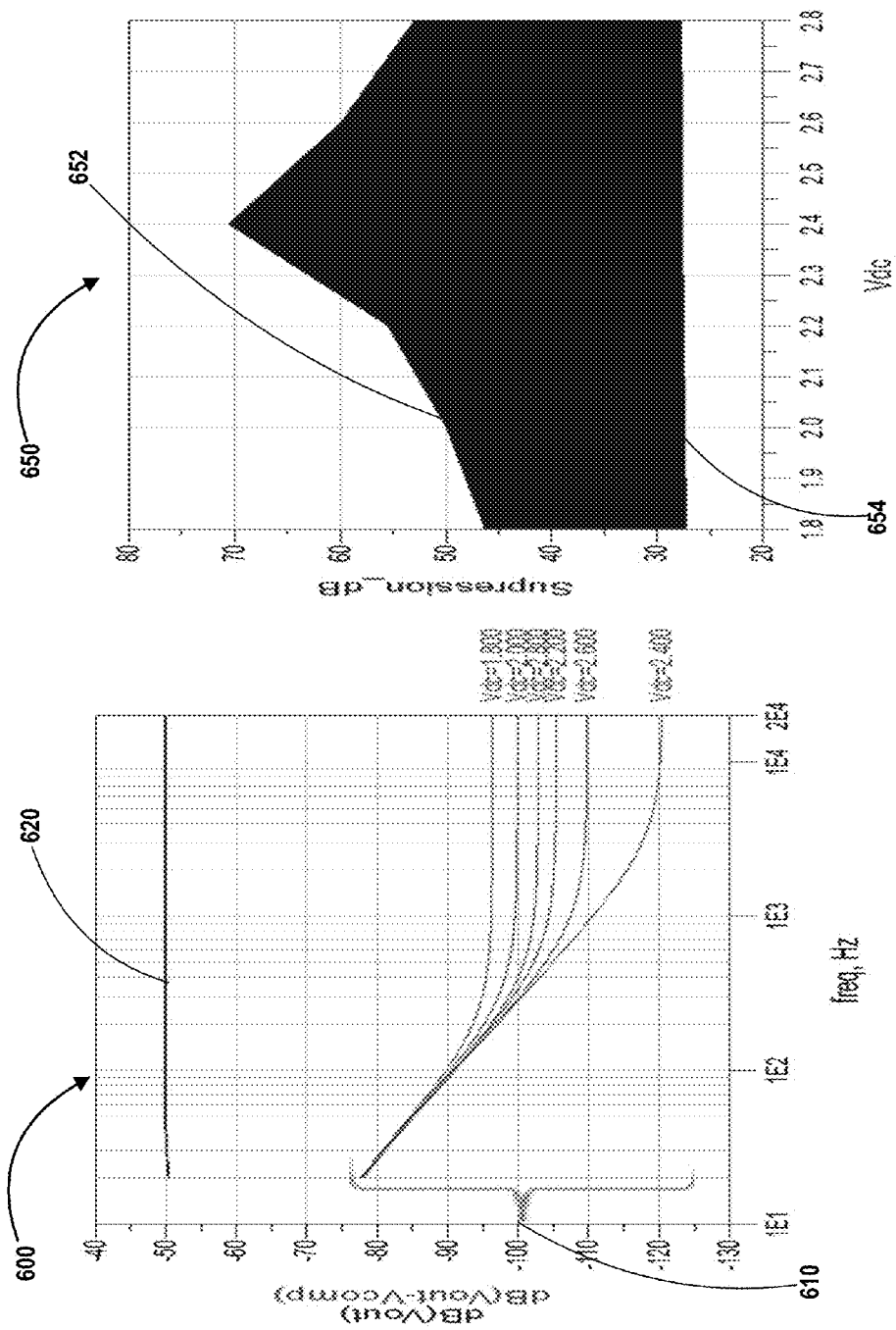
Figure 8:
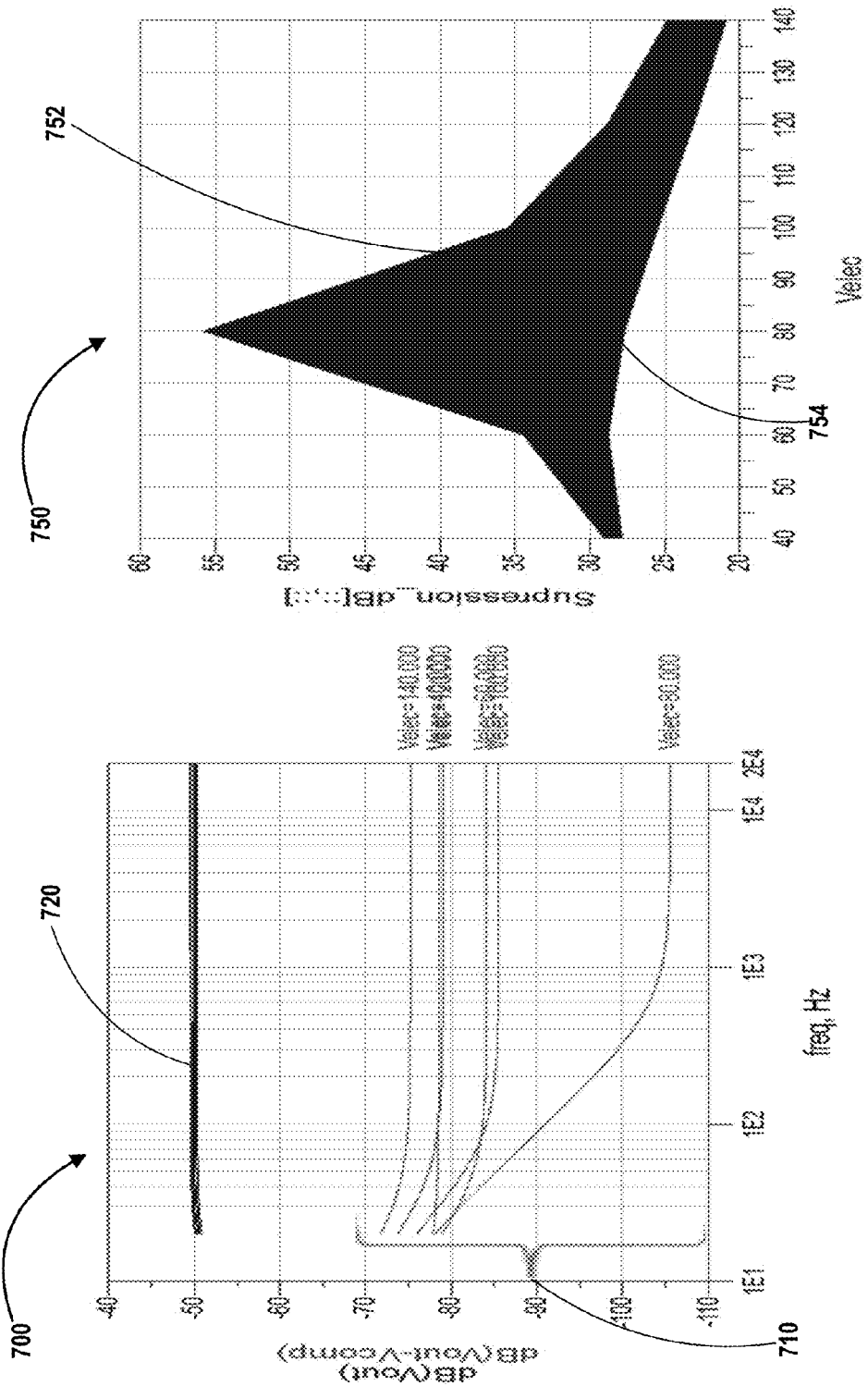
Figure 9:
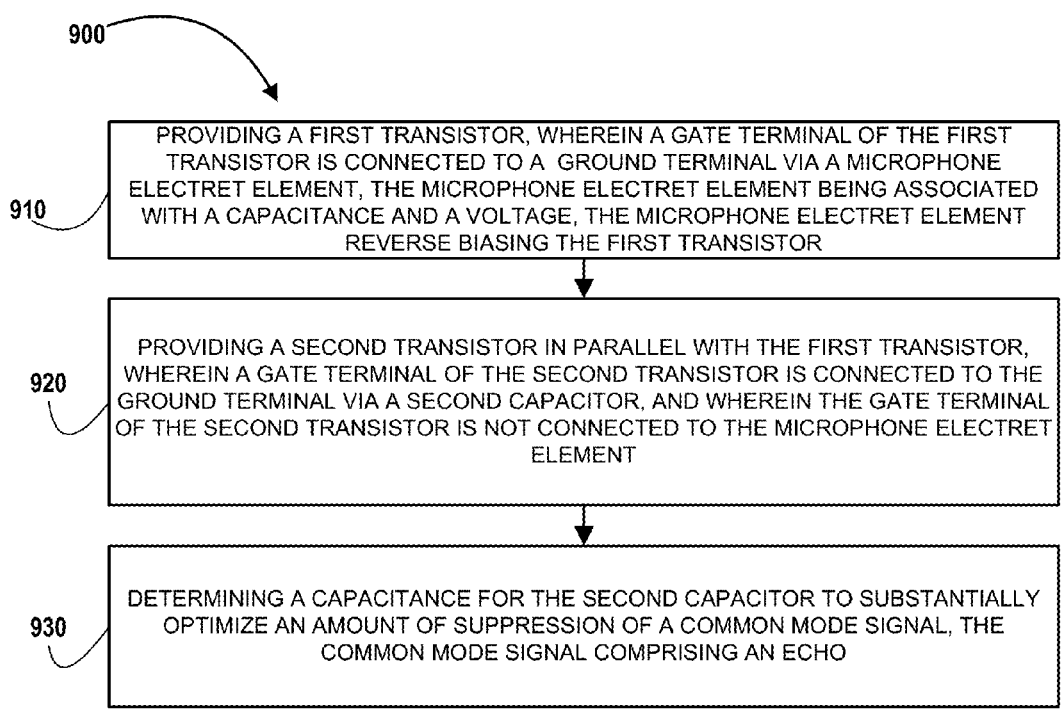

Having thus described embodiments of the invention in general terms, reference will now be made to the accompanying drawings, where:

FIG. 1 is a microphone system, in accordance with some embodiments of the present invention;

FIG. 2 is an echo-cancellation module associated with a microphone system, in accordance with some embodiments of the present invention;

FIG. 3 is a circuit implementation of the echo-cancellation module of FIG. 2, in accordance with some embodiments of the present invention;

FIG. 4 is a graph associated with the echo-cancellation module presented in FIG. 3, in accordance with some embodiments of the present invention;

FIG. 5 is circuit implementation of the echo-cancellation module of FIG. 2, in accordance with some embodiments of the present invention;

FIG. 6 is a graph associated with the echo-cancellation module presented in FIG. 5, in accordance with some embodiments of the present invention;

FIG. 7 is a graph associated with the echo-cancellation module presented in FIG. 5, in accordance with some embodiments of the present invention;

FIG. 8 is a graph associated with the echo-cancellation module presented in FIG. 5, in accordance with some embodiments of the present invention; and FIG. 9 is flow diagram illustrating an exemplary process flow for performing echo cancellation, in accordance with some embodiments of the present invention.

DETAILED DESCRIPTION OF EMBODIMENTS OF THE INVENTION

Embodiments of the present invention now may be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure may satisfy applicable legal requirements. Like numbers refer to like elements throughout.

Echo cancellation includes the process of identifying and reducing the magnitude or level of speaker output that reappears (e.g., with a delay, with modified frequencies, etc.) in microphone input. As used herein, echo comprises the sound waves output by the speaker that are received at the microphone (e.g., a membrane associated with the microphone). When this speaker output is identified, this speaker output may be subtracted or removed from the microphone input. The speaker and microphone may be part of the same system (e.g., a portable mobile communication system), or may be part of different systems. As used herein, echo cancellation refers to reducing the echo, either partially or completely. As used herein, a microphone may also be referred to as a microphone system, and a speaker may also be referred to as a speaker system. In some embodiments, the microphone system may also be referred to as the "near-end" and the speaker system may also be referred to as the "far end."

As used herein, the echo may be acoustic echo. However, embodiments of the invention are not limited to reducing or eliminating acoustic echo. Embodiments of the invention may be used to reduce or eliminate other types of echo (e.g., hybrid echo). Hybrid echo is the echo generated by a public switched telephone network (PSTN) through reflection of signals by a hybrid.

In embodiments described herein, an audio signal is produced by a speaker associated with a system. As used herein, an audio signal may also be referred to as a sound wave. However, the audio signal (e.g., a delayed and/or filtered version of the audio signal) is also picked up by the microphone associated with the system. The microphone picks up a delayed version of the audio signal because of the time delay for audio signal to travel to the microphone either via the system or via the environment. The microphone picks up a filtered version of the audio signal because frequencies of the audio signal may be absorbed by objects encountered on the path to the microphone. Additionally, the microphone picks up a filtered version of the audio signal because the audio signal may be reflected by objects, surfaces, or boundaries encountered on the path to the microphone. As described previously, the path from the speaker to the microphone may be internal to the system (e.g., internal to a housing associated with the system or via the surface of the housing associated with the system) or external to the system (e.g., via the environment in which the system is being operated). Therefore, embodiments of the invention are directed to generating or creating the delayed and filtered vision of the audio signal, such that this delayed and filtered version of the audio signal may be injected at the near-end (e.g., at the microphone) and subtracted from the audio input into the microphone, where the audio input includes both desirable and undesirable audio input as described below.

Additionally or alternatively, embodiments of the invention are directed to identifying the audio input at the microphone, and distinguishing the desirable audio input from the undesirable audio input. In some embodiments, desirable audio input includes voice signals from a user who uses the microphone to input the user's speech. In these embodiments, the system described herein may be configured to increase the magnitude of the desirable audio input signals. In some embodiments, undesirable audio input includes audio signals from a speaker that may be associated with or not associated with the microphone. In embodiments described herein, the system may be configured to decrease the magnitude of the undesirable audio input signals.

In embodiments described herein, the result is that the far-end talker hears an audio signal in which the echo has been reduced substantially. Therefore, the far-end talker who uses a communication device to communicate with a user of the microphone system described herein hears the user's voice and does not hear his or her own voice (or hears his or her own voice at reduced audio levels). In embodiments described herein, sound waves or audio waves are waveforms associated with sound signals or audio signals.

In some embodiments, a system as described herein may also be referred to as a microphone system or a microphone. However, in other embodiments, a system as described herein may be a system that does not include a microphone. Referring now to FIG. 1, FIG. 1 presents a microphone system 100. In some embodiments, the microphone system may be a condenser microphone system. In other embodiments, the microphone system may be some other type of microphone system. The microphone system 100 is housed in a single microphone housing 105. In some embodiments, the microphone housing 105 at least partially surrounds a membrane 110, an electrode 130, and a back chamber 120. For example as shown in FIG. 1, the microphone housing 105 at least partially encloses the membrane 110, the electrode 130, and the back chamber 120 on at least three sides or surfaces. The microphone housing 105 does not cover the membrane 110 to allow the membrane to receive sound waves. In some embodiments, the microphone system may be shaped as a cylinder (e.g., tubular) or as a cone. Therefore, while the microphone housing 105 defines at least two sides or surfaces of the microphone system (e.g., the longitudinal sides or surfaces of a cylindrical-shaped or conical-shaped microphone system), the membrane 110 defines or covers at least one side or surface of the microphone system (e.g., the head of a cylindrical-shaped or conical-shaped microphone system). In other embodiments, the microphone housing 105 may define more or less than two sides or surfaces of the microphone system, and the membrane 110 may define or cover more or less than one side or surface of the microphone system. In some embodiments, one or more electrical connections may pass through the microphone housing 105. As used herein, a side of the microphone housing 105 may also be referred to as a surface of the microphone housing 105.

In order to counter low frequency pressure changes such as weather changes or altitude changes that may affect the output of the microphone system the microphone system is provided with a leakage aperture 140 between the back chamber 120 and the atmosphere or the outside environment. This leakage aperture 140 may be a ventilation aperture in the microphone housing 105. Since wind noise is turbulent by nature, the leakage aperture 140 is placed near the membrane 110 of the microphone system.

When sound pressure changes between the back chamber 120 and the free air (i.e., the atmosphere) cause the membrane 110 to move and take a new position, the distance between the membrane 110 and the electrode 130 changes (e.g., increases or decreases) resulting in a change of capacitance between the membrane 110 and the electrode 130. This change of capacitance may be read out or interpreted as an electrical signal. The change in capacitance causes the voltage to the gate of a transistor (e.g., the transistor 210 in FIG. 2) to vary. The variation in the gate voltage causes variation in the amount of current flowing through the transistor (e.g., the transistor 210 in FIG. 2). Therefore, the membrane 110 and the electrode 130 act as opposite plates of a capacitor, which is represented as the capacitive electret element 230 in FIG. 2. The membrane 110 may be a movable front plate, while the electrode 130 may be a back plate that is fixed in position. In some embodiments, the electrode 130 may be a movable plate as well.

In embodiments where the microphone system is a condenser microphone system, the microphone system may either be externally polarized or permanently polarized. An externally polarized microphone system may use an external power source to provide the polarizing voltage needed for the microphone capacitive circuit. A permanently polarized microphone system may have the polarizing voltage applied during the manufacture of the microphone system, and this polarizing voltage is retained by the microphone system during its lifetime.

In some embodiments, the present invention solves the challenge of determining the type of filtering and/or delaying that must be applied to the speaker audio output signal such that the filtered and delayed version of the speaker audio output signal is substantially accurately created by the system to be injected into the microphone system (e.g., at the near-end). In order to reproduce a delayed and filtered version of the speaker audio output signal, a system described herein may generate a voltage reference (may be also be referred to as a reference voltage) that provides input to an audio amplifier (e.g., a differential audio amplifier), where the voltage reference has the same average voltage across the voltage reference when the microphone system does not pick up or receive any audio signal as when the microphone system does pick up or receive an audio signal. In some embodiments, the voltage reference produces a constant voltage regardless of the loading on the system, variations in power supply associated with the system, changes in internal temperature for the system, changes in temperature external to the system, the passage of time, etc.

The audio amplifier located in the microphone system receives as input a first signal (e.g., a voltage such as the drain-source voltage across the transistor) associated with a transistor (e.g., a field-effect transistor, a bipolar junction transistor, etc.) and a second signal associated with a voltage reference (e.g., a voltage across the voltage reference). The audio amplifier may subtract the second signal from the first signal, and may subsequently amplify the resultant signal by a gain factor. The audio amplifier may then transmit the resultant signal to one or more other electronic devices for further processing. The invention is not limited to any particular type of transistor and is not limited to any particular type of audio amplifier.

In some embodiments, the value of the constant voltage for the voltage reference may be automatically selected by the system described herein. In some embodiments, the system described herein may determine the voltage across the transistor (e.g., the transistor 210 in FIG. 2) and may configure the voltage reference such that the voltage reference (e.g., the transistor 220 in FIG. 2) has substantially the same voltage as the transistor (e.g., the transistor 210 in FIG. 2). In other embodiments, the value of the constant voltage may be automatically selected based on the characteristics of echo (e.g., the magnitude and/or frequencies of the speaker audio output signal) to be removed from the microphone system input. In still other embodiments, a user of the system may modify the value of the constant voltage for the voltage reference via a graphical computing interface associated with the system.

Sometimes, the voltage reference is generated using a resistor that has a resistance value that is a statistical average of the resistance across the transistor (e.g., the transistor 210 in FIG. 2) in the microphone system for a number of transistor samples. However, the resistance of a transistor has a wide variance over a larger number of transistor samples. The resistance of an individual transistor may be two or three times greater than or smaller than another individual transistor. One method of reducing the wide variance is to test each individual transistor (or each individual microphone system) and eliminate the transistors (or eliminate the microphone systems) outside a predetermined resistance range. However, this method would be prohibitively expensive when transistors are manufactured on a large scale. The present invention replaces the resistor with a transistor to generate the voltage reference. As used herein, the resistance of a transistor may also be referred to as an impedance of the transistor.

Referring now to FIG. 2, FIG. 2 presents an echo cancellation module 200, in accordance with one embodiment of the present invention. FIG. 2 presents a circuit that is located in a system described herein. FIG. 2 presents a first transistor 210, a second transistor 220, and a capacitive electret element 230. The first transistor 210 may be a field-effect transistor FET (e.g., a junction field-effect transistor JFET), a bipolar junction transistor, etc. The second transistor 220 may be a field-effect transistor FET (e.g., a junction field-effect transistor JFET), a bipolar junction transistor, etc. The invention is not limited to any particular types of transistors for the first 210 and second 220 transistors. The first transistor 210 may be at least one of n-doped or p-doped. The second transistor 220 may be at least one of n-doped or doped. In some embodiments, the first transistor 210 may be a different type of transistor when compared to the second transistor 220. Additionally, in some embodiments, the first transistor 210 may be doped differently when compared to the second transistor 220, e.g., the first transistor 210 may be n-doped while the second transistor 220 may be p-doped, or vice versa. In embodiments described herein, the second transistor may also be referred to as the compensation transistor because the second transistor provides a signal that 'compensates' for the echo (speaker audio signal) that is received at the microphone system.

As presented in FIG. 2, the first transistor 210 and the second transistor 220 are in a parallel configuration. However, in other embodiments, the first transistor 210 and the second transistor 220 may be in a different type of configuration. Additionally, each of the first transistor 210 and the second transistor 220 may represent multiple transistors. For example, the first transistor 210 or the second transistor 220 may represent two distinct transistors that are in a series configuration. Node A is connected to a first input of an audio amplifier described herein. Node B is connected to a second input of an audio amplifier described herein. Therefore, while node A is associated with a signal from the first transistor 210 (e.g., voltage across first transistor 210), node B is associated with a signal from the second transistor 220 (e.g., voltage across second transistor 220). Node C may represent the ground terminal.

The first transistor 210 may comprise three terminals: a gate terminal, a drain terminal, and a source terminal. The gate terminal is connected to the capacitive electret element 230. The drain terminal is connected to node A. The source terminal is connected to node C. The second transistor 220 may comprise three terminals: a gate terminal, a drain terminal, and a source terminal. The drain terminal is connected to node B. The source terminal is connected to node C. The gate terminal may be connected to a node (e.g., node B or some other node not presented in FIG. 2) that may be connected to a voltage source in order to establish a voltage between the gate terminal and the source terminal of the second transistor 220. In some embodiments, for at least one of the first transistor 210 or the second transistor 220, the source terminal may take the place of the drain terminal and the drain terminal may take the place of the source terminal. In some embodiments, this causes a change in direction of the current that flows through the transistor.

In embodiments of the invention, both the first transistor 210 and the second transistor 220 are included in or housed in the same semiconductor package. As used herein, a semiconductor package is a casing (e.g., made of glass, ceramic, plastic, metal, or any combination thereof, etc.) that includes one or more semiconductor electronic components. The electronic components may include one or transistors, one or more discrete components such as resistors, capacitors, inductors, etc. The semiconductor package may also include one or more pins that protrude out of the semiconductor package. Each of the one or more pins may be used to establish one or more connections to one or more terminals of the electronic components included in the semiconductor package. Therefore, the semiconductor package described herein comprises at least one pin associated with the first transistor and at least one pin associated with the second transistor.

In some embodiments, the first transistor 210 and the second transistor 220 are selected from the same chip manufacturing batch. In other embodiments, the first transistor 210 and the second transistor 220 are manufactured next to each other (or proximate each other) on the same silicon chip without being separated at a later stage following the manufacture. A package that comprises the first transistor 210 and the second transistor 220 manufactured next to each other on the same silicon chip may be known as a "double package" because it includes two transistors compared to a single package that includes only one transistor. A chip described herein is not limited to being manufactured using silicon. The chip may be manufactured using other semiconductor materials instead of, or in addition to, silicon.

In some embodiments, the voltage across the first transistor changes based at least partially on a connection to the at least one pin associated with the first transistor. In some embodiments, the voltage across the second transistor does not change based at least partially on a connection to the at least one pin associated with the second transistor. Therefore, the voltage across the second transistor may remain constant regardless of any electrical components connected to the at least one pin associated with the second transistor. Additionally, in some embodiments, the voltage across the second transistor remains constant regardless of the loading on the semiconductor package, variations in power supply associated with the semiconductor package, changes in internal temperature for the semiconductor package, changes in temperature external to the semiconductor package, the passage of time, etc. In some embodiments, at least one of the semiconductor package or the microphone system described herein configures the voltage across the second transistor to be substantially equal to the voltage across the first transistor, regardless of electrical components that are connected to the at least one pin associated with the second transistor. In some embodiments, the semiconductor package may comprise six distinct pins, one pin each to the drain, source, and gate terminals of the first transistor and one pin each to drain, source, and gate terminals of the second transistor. The semiconductor package described herein is not limited to be used in microphone systems and may be used in any other system (e.g., any system where a voltage reference is needed).

The addition of the second transistor into the same semiconductor package as the first transistor enables generation of a voltage reference without requiring a resistor in the semiconductor package for generating the voltage reference. The addition of the second transistor to the semiconductor package enables generation of a more accurate voltage reference without requiring testing of each microphone system. As used herein, an accurate voltage reference is a voltage reference that generates a voltage that remains constant regardless of the loading on the system, variations in power supply associated with the system, changes in internal temperature for the system, changes in external temperature, the passage of time, etc. Additionally, in some embodiments, an accurate voltage reference is a voltage reference that has a voltage that is substantially identical to the voltage across the first transistor 110. Additionally, in some embodiments, an accurate voltage reference is a voltage reference that actually produces a substantially accurate voltage that is desired for the operation of a function or an application where a substantially accurate voltage reference is necessary.

In embodiments described herein, the addition of a second transistor to a semiconductor package that already includes the first transistor would require an addition of one extra pin on to the semiconductor package. Additionally, the addition of a second transistor eliminates a resistor (e.g., a resistor that provides a voltage reference) from at least one of the semiconductor package described herein or the microphone system described herein. Therefore, the semiconductor package described herein may not comprise a resistor. Additionally, the addition of the second transistor allows a large spread of resistances among microphone system samples (or among resistances associated with transistors as described previously). Therefore, the present invention creates a more accurate reference voltage while also reducing manufacturing costs (e.g., reducing testing costs such as testing of microphone system samples or transistor samples).

The system described herein may be configured to produce substantially the same amount of current in both the first transistor 210 and the second transistor 220. The first transistor 210 that is connected to the capacitive electret element 230 is reverse biased by the capacitive electret element 230. As used herein, biasing is the method of establishing a predetermined voltage across (and/or a predetermined current that flows through) a circuit element (e.g., a transistor). The reverse biasing of the first transistor 210 is simulated in the second transistor 220 that is not connected to the capacitive electret element 230. Therefore, one or more electronic components (e.g., a voltage source in combination with one or more passive components, etc.) in the system may be used to bias (e.g., forward bias or reverse bias) the second transistor 220 such that the amount of current flowing through the second transistor 220 substantially matches or is substantially similar to the amount of current flowing through the first transistor 210.

In some embodiments, the first transistor 210 that is reverse biased by the capacitive electret element 230 may function as an impedance converter that converts a higher impedance (e.g., 100 MOhm) to a lower impedance (e.g., 2 kOhm), or in other embodiments, converts a lower impedance to a higher impedance. In some embodiments, even the second transistor 220 may also function as an impedance converter that converts a higher impedance (e.g., 100 MOhm) to a lower impedance (e.g., 2 kOhm), or in other embodiments, converts a lower impedance to a higher impedance.

Referring now to FIG. 3, FIG. 3 presents a circuit implementation of the system presented in FIG. 2. In the embodiment presented in FIG. 3, the microphone electret element comprises capacitor C1 230, voltage source SRC1 231, and resistor R4 232. For exemplary purposes, C1 represents the capacitance associated with the microphone electret element and may be 5 pF, SRC1 is a DC voltage source that represents the voltage across the microphone electret element, and R4 may be 4 GOhms. In some embodiments, the capacitance C1 230 associated with the microphone electret element may also be referred to as the capacitive electret element. In some embodiments, the microphone electret element may itself be referred to as the capacitive electret element. In some embodiments, the voltage across the microphone electret element (SRC1) may also be referred to Velec. In some embodiments, the value of Velec may be equal to the value of Vdc, which is the voltage associated with the biasing voltage source SRC2.

The microphone sub-circuit comprises the microphone electret element (i.e., capacitor C1 230, voltage source SRC1 231, and resistor R4 232) along with the first transistor 210. The gate terminal of the first transistor 210 is connected to the capacitor C1 230 (which may also be referred to as the capacitive electret element). As described previously, the capacitor C1 230 reverse biases the first transistor 210.

The echo cancellation sub-circuit comprises capacitor C2 221 (presented in FIG. 5), resistor R3 222, and the second transistor 220. For exemplary purposes, R3 may be 4 GOhms. Additionally, in the embodiment presented in FIG. 3, C2 is shorted such that the gate node of the second transistor 220 is connected to the ground terminal. Therefore, embodiments of the invention are directed to combining the microphone sub-circuit with the echo cancellation sub-circuit. The sub-circuits are combined as indicated in FIG. 3 using resistor R1 232, resistor R2 234, voltage source SRC2 236, and voltage source SRC4 238. The voltage source SRC2 (along with the resistors R1 and R2) may be used to establish a biasing voltage (and/or a bias current) for operation of the microphone circuit. For exemplary purposes, R1 may be 2.2 kOhms, R2 may be 2.2 kOhms, SRC2 is a DC voltage source, and SRC4 is an AC voltage source. In some embodiments, the voltage provided by SRC2 remains constant in time, while in other embodiments, the voltage provided by SRC2 may vary in time.

Output signals produced from a speaker system that are received at a microphone system (i.e., the echo) are a source of common-mode voltage and produce a common-mode signal in the circuit presented in FIG. 3. In some embodiments, the common-mode signal is generated because of the difference in ground potentials between the speaker system and the microphone system. The voltage provided by SRC4 is a common mode disturbance signal and produces or causes simulation of the echo described herein. In some embodiments, the common mode signal for the microphone system may be obtained by measuring the voltage between the node Vout 292 and the ground terminal in FIG. 3. In some embodiments, the common mode signal may represent or comprise a noise signal (instead of or in addition to the echo signal). Therefore, the microphone system described herein may be used to substantially eliminate or suppress or cancel a noise signal (instead of or in addition to the echo signal).

In the embodiment presented in FIG. 3, SRC4 is chosen to be 10 mV. The AC voltage source SRC4 may be swept in frequency from a low frequency (e.g., 20 Hz) to a high frequency (e.g., 20 kHz). Therefore, the signals produced by the AC voltage source comprise a plurality of frequencies. The compensation voltage (Vcomp) or the reference voltage as provided by the second transistor 220 may be determined by measuring the voltage between node 291 and the ground terminal. As indicated in FIG. 3, the node 291 represents the node associated with the drain terminal of the second transistor 220. The output voltage (or the common mode voltage signal) for the microphone circuit (Vout) may be determined by measuring the voltage between node 292 and the ground terminal. As indicated in FIG. 3, the node 292 represents the node associated with the drain terminal of the first transistor 210. In some embodiments, the common mode signal may be at least a part (or an entire part) of the voltage measured at the drain terminal of the first transistor.

As described herein, in some embodiments, a common mode signal is at least a part of a signal (e.g., a voltage signal) between a drain terminal of the first transistor and the ground terminal (or the source terminal of the first transistor). In other embodiments, the common mode signal may be a current signal, where the current signal is associated with the current flowing between the drain and source terminals of the first transistor.

Referring now to FIG. 4, FIG. 4 presents graphs 300 and 350 associated with the system presented in FIG. 3. The first graph 300 presents two graphs 320 and 310. The graph 320 represents the signal level (e.g., the voltage level) of the common mode of the microphone circuit without echo cancellation as a function of frequency. As indicated by graph 320, the signal level is about −49.8 dB. The graph 310 represents the signal level (e.g., the voltage level) of the common mode of the microphone circuit with echo cancellation as caused by the compensation signal provided by the second transistor 220. As indicated by graph 310, the signal level is −52.2 dB. The second graph 350 presents a graph of the echo suppression or cancellation level associated with the system presented in FIG. 3 as a function of frequency. The suppression level is calculated by subtracting Vcomp (node 291) from Vout (node 292). The graph 330 indicates that the echo suppression level is 2.3 dB.

Referring now to FIG. 5, FIG. 5 presents an embodiment of the system that is different from the embodiment presented in FIG. 3. For the embodiment of the system presented in FIG. 3, C2 is shorted such that the gate node of the second transistor 220 is connected to the ground terminal. For the embodiment of the system presented in FIG. 5, the gate node of the second transistor 220 is connected to C2. C2 may have a non-zero static capacitance to ground. However, in alternate embodiments, C2 may have a capacitance that varies in time or frequency. The value for the capacitance C2 is selected based on an optimization process. The optimization process may consider the characteristics of other components present on the circuit. For example, C2 is selected based on characteristics (or values) associated with at least one of the first transistor 210, the second transistor 220, the microphone electret element (e.g., C1 230 and/or SRC1 231 and/or R4 232), R1 232, R2 234, R3 222, SRC2 236, or SRC4 238. In embodiments where an optimal value for the capacitance C2 is determined, substantial echo cancellation may be achieved (e.g., 55 dB at frequencies above 1 kHz). The echo cancellation achieved with an optimal capacitance for C2 may be maintained (e.g., within a predetermined range of echo cancellation levels) even with at least one of a change in bias voltage (SRC2 236) or a change in microphone electret voltage (SRC1 231).

For the embodiment presented in FIG. 5, the value of the capacitance for C2 is swept from 3 pF to 10 pF in 0.5 pF steps. Therefore, as AC voltage source SRC4 is swept in frequency from a low frequency (e.g., 20 Hz) to a high frequency (e.g., 20 kHz), the capacitance of C2 is swept from 3 pF to 10 pF.

Referring now to FIG. 6, FIG. 6 presents graphs 500 and 550 associated with the system presented in FIG. 5. The first graph 500 presents graph 520. The graph 520 represents the signal level (e.g., the voltage level) of the common mode of the microphone circuit without echo cancellation as a function of frequency. As indicated by graph 520, the signal level is about −49.8 dB. The first graph 500 also presents a set of graphs 510. Each of the graphs is associated with a different capacitance of C2 that is swept from 3 pF to 10 pF in 0.5 pF steps.

Each of the graphs 510 represents the signal level (e.g., the voltage level) of the common mode of the microphone circuit with echo cancellation as caused by the second transistor 220 for a different capacitance of C2 as a function of frequency. As indicated by graph 510, the signal levels range from −61 dB to −104.8 dB. The second graph 550 presents a graph of the echo suppression or cancellation level associated with the system presented in FIG. 5 as a function of the capacitance of C2. The suppression level is calculated by subtracting Vcomp (node 291) from Vout (node 292). The graph 550 indicates that the highest suppression level (55 dB) is achieved when the capacitance of C2 is 6 pF. Additionally, as indicated by graph 550, the suppression increases as indicated by graph 550 when the capacitance of C2 increases. Once the highest suppression is achieved for a particular value of C2 (e.g., 6 pF), the suppression level decreases if the capacitance of C2 increases beyond that particular value (e.g., 6 pF). Therefore, the process of capacitance optimization as described herein is identifying a capacitance for C2 that produces a maximum amount of suppression. As indicated by the graph 550, even if the optimum capacitance for C2 is not identified, the amount of suppression may be in the range of 20 dB to 30 dB, which is greater than the amount of suppression achieved with the system in FIG. 3 and presented in FIG. 4. Additionally, as indicated in FIG. 6, in some embodiments, the optimum value for the capacitance of C2 (6 pF) is not substantially equal to the capacitance of the capacitive electret element 230 (5 pF) in FIG. 5. However, in other embodiments, the optimum value for the capacitance of C2 may be substantially equal to the capacitance of the capacitive electret element 230 in FIG. 5.

In some embodiments, the process of capacitance optimization or selection as described herein is identifying a capacitance for C2 that produces a maximum amount of suppression. In other embodiments, the process of capacitance optimization or selection is identifying a capacitance for C2 that does not produce the maximum amount of suppression, but produces at least some amount (e.g., a minimal amount) of suppression. For example, in some embodiments, the capacitance of C2 is selected to produce a predetermined amount of suppression (e.g., 30 dB). As a further example, in some embodiments, the capacitance of C2 is selected to reduce the common mode signal by at least one of a predetermined absolute amount (e.g., 30 dB) or predetermined percentage amount (e.g., 30%).

Thus, in some embodiments, the capacitance of C2 is optimized at the time of designing the microphone, and is selected based on characteristics associated with at least one of the first transistor 210 or the capacitive electret element 230, or even on other components of the microphone circuit (e.g., voltage source SRC1, resistor R4, etc.). Additionally, in some embodiments, the capacitance of C2 is selected based at least partially one at least one of other components of the circuit illustrated in FIG. 5 (e.g., second transistor 220, resistor R1, resistor R2, voltage source SRC2, AC voltage source SRC4, etc.). Additionally, in some embodiments, the capacitance of C2 is selected based at least partially on one or more components not illustrated in FIG. 5.

Graph 550 in FIG. 6 also indicates the upper limit 552 of the suppression level associated with higher frequencies. Graph 550 in FIG. 6 also indicates the lower limit 554 of the suppression level associated with lower frequencies. As indicated previously, AC voltage source SRC4 may be swept in frequency from a low frequency (e.g., 20 Hz) to a high frequency (e.g., 20 kHz). Therefore, the higher frequencies that correspond to the higher suppression levels may be frequencies closer to 20 kHz, and the lower frequencies that correspond to the lower suppression levels may be frequencies closer to 20 Hz. Thus, as indicated in FIG. 6, as the frequency of the common mode disturbance signal (echo) increases, the amount of suppression associated with the signal also increases.

Referring now to FIG. 7, FIG. 7 presents graphs 600 and 650 associated with the system presented in FIG. 5. The first graph 600 presents graph 620. The graph 620 represents the signal level (e.g., the voltage level) of the common mode of the microphone circuit without echo cancellation as a function of frequency. As indicated by graph 620, the signal level is about −49.8 dB. For the simulation associated with the graphs 600 and 650, the capacitance of C2 may be chosen as 6 pF, which was determined as the optimum capacitance as described earlier. The first graph 600 also presents a set of graphs 610. Each of the graphs is associated with a different voltage for SRC2, which is used to bias the microphone circuit. As indicated in FIG. 5, SRC2 takes a voltage of Vdc. In some embodiments, Vdc may also be the voltage for SRC1, which is the voltage for the microphone electret element. The voltage source SRC1 may be used to bias at least one of the first transistor 210 or the second transistor 220.

For the set of graphs 610, each of the graphs is associated with a different voltage of Vdc, where Vdc is swept from 1.8 V to 2.8 V in 0.2 V steps. Each of the graphs 610 represents the signal level (e.g., the voltage level) of the common mode of the microphone circuit with echo cancellation as caused by the second transistor 220 for a voltage of Vdc as a function of frequency. As indicated by graph 610, the signal levels range from −95 dB to −120 dB. The second graph 650 presents a graph of the echo suppression or cancellation level associated with the system presented in FIG. 5 as a function of Vdc. The suppression level is calculated by subtracting Vcomp (node 291) from Vout (node 292). The graph 650 indicates that the highest suppression level (~70 dB) is achieved when Vdc is 2.4 V. Additionally, as indicated by graph 650, the suppression increases as indicated by graph 650 when the voltage of Vdc increases. Once the highest suppression is achieved for a particular value of Vdc (e.g., 2.4 V), the suppression level decreases if the voltage of Vdc increases beyond that particular value (e.g., 2.4 V). Therefore, the process of bias voltage optimization as described herein is identifying a bias voltage Vdc for SRC2 (and/or SRC1) that produces a maximum amount of suppression. As indicated by the graph 550, even if the optimum voltage for Vdc is not identified or obtained, the amount of suppression may be in the range of 25 dB to 60 dB, which is greater than the amount of suppression achieved with the system in FIG. 3 and presented in FIG. 4. Therefore, as indicated in graph 650, changing the voltage of Vdc does not cause substantial changes in the suppression levels, and the suppression level is good for a wide variation in the voltage of Vdc. In some embodiments, the suppression level is good for a wide variation in the voltage of Vdc when an optimal or close-to-optimal capacitance is chosen for C2.

Graph 650 in FIG. 7 also indicates the upper limit 652 of the suppression level associated with higher frequencies. Graph 650 in FIG. 7 also indicates the lower limit 654 of the suppression level associated with lower frequencies. As indicated previously, AC voltage source SRC4 may be swept in frequency from a low frequency (e.g., 20 Hz) to a high frequency (e.g., 20 kHz). Therefore, the higher frequencies that correspond to the higher suppression levels may be frequencies closer to 20 kHz, and the lower frequencies that correspond to the lower suppression levels may be frequencies closer to 20 Hz. Thus, as indicated in FIG. 7, as the frequency of the common mode disturbance signal (echo) increases, the amount of suppression associated with the signal also increases.

Referring now to FIG. 8, FIG. 8 presents graphs 700 and 750 associated with the system presented in FIG. 5. The first graph 700 presents graph 720. The graph 720 represents the signal level (e.g., the voltage level) of the common mode of the microphone circuit without echo cancellation as a function of frequency. As indicated by graph 720, the signal level is about −49.8 dB. For the simulation associated with the graphs 700 and 750, the capacitance of C2 may be chosen as 6 pF, which was determined as the optimum capacitance as described earlier. The first graph 700 also presents a set of graphs 710. Each of the graphs is associated with a different voltage for Velec (SRC1 231), which is the voltage for the microphone electret element.

For the set of graphs 710, each of the graphs is associated with a different voltage of Velec, where Velec is swept from 40 mV to 140 mV in 20 mV steps. Each of the graphs 710 represents the signal level (e.g., the voltage level) of the common mode of the microphone circuit with echo cancellation as caused by the second transistor 220 for a voltage of Velec as a function of frequency. As indicated by graph 710, the signal levels range from −75 dB to −112 dB. The second graph 750 presents a graph of the echo suppression or cancellation level associated with the system presented in FIG. 5 as a function of Velec. The suppression level is calculated by subtracting Vcomp (node 291) from Vout (node 292). The graph 750 indicates that the highest suppression level (−55 dB) is achieved when Velec is 80 mV. Additionally, as indicated by graph 750, the suppression increases as indicated by graph 750 when the voltage of Velec increases. Once the highest suppression is achieved for a particular value of Velec (e.g., 80 mV), the suppression level decreases if the voltage of Velec increases beyond that particular value (e.g., 80 mV). Therefore, the process of microphone electret element voltage optimization as described herein is identifying a microphone electret element voltage Velec for SRC1 that produces a maximum amount of suppression. As indicated by the graph 750, even if the optimum voltage for Velec is not identified or obtained, the amount of suppression may be in the range of 20 dB to 45 dB, which is greater than the amount of suppression achieved with the system in FIG. 3 and presented in FIG. 4.

In some embodiments, the voltage of Velec (SRC1 231) is maintained at a constant level (e.g., at a voltage level equal to SRC2 236), while in other embodiments, the voltage of Velec is varied as a function of time or frequency. The variation in suppression levels associated with different voltages of Velec shows the importance of selecting an optimal capacitance value for C2. In embodiments descried herein, the second transistor 220 does not need to be biased at the gate terminal of the second transistor 220. Instead, choosing an optimal capacitance value for C2 produces a high level of suppression of the common mode disturbance signal (echo).

Graph 750 in FIG. 8 also indicates the upper limit 752 of the suppression level associated with higher frequencies. Graph 750 in FIG. 8 also indicates the lower limit 754 of the suppression level associated with lower frequencies. As indicated previously, AC voltage source SRC4 may be swept in frequency from a low frequency (e.g., 20 Hz) to a high frequency (e.g., 20 kHz). Therefore, the higher frequencies that correspond to the higher suppression levels may be frequencies closer to 20 kHz, and the lower frequencies that correspond to the lower suppression levels may be frequencies closer to 20 Hz. Thus, as indicated in FIG. 8, as the frequency of the common mode disturbance signal (echo) increases, the amount of suppression associated with the signal also increases.

Referring now to FIG. 9, FIG. 9 presents a process flow 900 for echo cancellation. The various process blocks presented in FIG. 9 may be executed in an order that is different from that presented in FIG. 9. At block 910, the exemplary method comprises providing a first transistor, wherein a gate terminal of the first transistor is connected to a ground terminal via a microphone electret element, the microphone electret element being associated with a capacitance and a voltage, the microphone electret element reverse biasing the first transistor. At block 920, the method comprises providing a second transistor in parallel with the first transistor, wherein a gate terminal of the second transistor is connected to the ground terminal via a capacitor, and wherein the gate terminal of the second transistor is not connected to the microphone electret element. At block 930, the method comprises determining a capacitance for the capacitor to substantially optimize an amount of suppression of a common mode signal, the common mode signal comprising an echo.

In some embodiments, the various systems described herein may comprise at least one processor, at least one memory, and at least one module stored in the memory that is executable to perform or to cause one or more other modules to perform the various processes described herein. In accordance with embodiments of the invention, the term "module" with respect to a system (or a device) may refer to a hardware component of the system, a software component of the system, or a component of the system that includes both hardware and software. As used herein, a module may include one or more modules, where each module may reside in separate pieces of hardware or software.

In some embodiments, an exemplary computer program product for performing echo cancellation comprises a non-transitory computer readable medium comprising code configured to perform one or more processes described herein or to causes one or more systems described herein to perform one or more processes described herein.

As used herein, the term "automatic" refers to a function, a process, a method, or any part thereof, which is executed by computer software upon occurrence of an event or a condition without intervention by a user. As used herein, the phrase "greater than" means "greater than or equal to."

Although many embodiments of the present invention have just been described above, the present invention may be embodied in many different forms and should not be construed as limited to the embodiments set forth herein; rather, these embodiments are provided so that this disclosure will satisfy applicable legal requirements. Also, it will be understood that, where possible, any of the advantages, features, functions, devices, and/or operational aspects of any of the embodiments of the present invention described and/or contemplated herein may be included in any of the other embodiments of the present invention described and/or contemplated herein, and/or vice versa. In addition, where possible, any terms expressed in the singular form herein are meant to also include the plural form and/or vice versa, unless explicitly stated otherwise. As used herein, "at least one" shall mean "one or more" and these phrases are intended to be interchangeable. Accordingly, the terms "a" and/or "an" shall mean "at least one" or "one or more," even though the phrase "one or more" or "at least one" is also used herein. Like numbers refer to like elements throughout.

As will be appreciated by one of ordinary skill in the art in view of this disclosure, the present invention may include and/or be embodied as an apparatus (including, for example, a system, machine, device, computer program product, and/or the like), as a method (including, for example, a business method, computer-implemented process, and/or the like), or as any combination of the foregoing. Accordingly, embodiments of the present invention may take the form of an entirely business method embodiment, an entirely software embodiment (including firmware, resident software, microcode, stored procedures in a database, etc.), an entirely hardware embodiment, or an embodiment combining business method, software, and hardware aspects that may generally be referred to herein as a "system." Furthermore, embodiments of the present invention may take the form of a computer program product that includes a computer-readable storage medium having one or more computer-executable program code portions stored therein. As used herein, a processor, which may include one or more processors, may be "configured to" perform a certain function in a variety of ways, including, for example, by having one or more general-purpose circuits perform the function by executing one or more computer-executable program code portions embodied in a computer-readable medium, and/or by having one or more application-specific circuits perform the function.

It will be understood that any suitable computer-readable medium may be utilized. The computer-readable medium may include, but is not limited to, a non-transitory computer-readable medium, such as a tangible electronic, magnetic, optical, electromagnetic, infrared, and/or semiconductor system, device, and/or other apparatus. For example, in some embodiments, the non-transitory computer-readable medium includes a tangible medium such as a portable computer diskette, a hard disk, a random access memory (RAM), a read-only memory (ROM), an erasable programmable read-only memory (EPROM or Flash memory), a compact disc read-only memory (CD-ROM), and/or some other tangible optical and/or magnetic storage device. In other embodiments of the present invention, however, the computer-readable medium may be transitory, such as, for example, a propagation signal including computer-executable program code portions embodied therein.

One or more computer-executable program code portions for carrying out operations of the present invention may include object-oriented, scripted, and/or unscripted programming languages, such as, for example, Java, Perl, Smalltalk, C++, SAS, SQL, Python, Objective C, JavaScript, and/or the like. In some embodiments, the one or more computer-executable program code portions for carrying out operations of embodiments of the present invention are written in conventional procedural programming languages, such as the "C" programming languages and/or similar programming languages. The computer program code may alternatively or additionally be written in one or more multi-paradigm programming languages, such as, for example, F#.

Some embodiments of the present invention are described herein with reference to flowchart illustrations and/or block diagrams of apparatus and/or methods. It will be understood that each block included in the flowchart illustrations and/or block diagrams, and/or combinations of blocks included in the flowchart illustrations and/or block diagrams, may be implemented by one or more computer-executable program code portions. These one or more computer-executable program code portions may be provided to a processor of a general purpose computer, special purpose computer, and/or some other programmable data processing apparatus in order to produce a particular machine, such that the one or more computer-executable program code portions, which execute via the processor of the computer and/or other programmable data processing apparatus, create mechanisms for implementing the steps and/or functions represented by the flowchart(s) and/or block diagram block(s).

The one or more computer-executable program code portions may be stored in a transitory and/or non-transitory computer-readable medium (e.g., a memory, etc.) that can direct, instruct, and/or cause a computer and/or other programmable data processing apparatus to function in a particular manner, such that the computer-executable program code portions stored in the computer-readable medium produce an article of manufacture including instruction mechanisms which implement the steps and/or functions specified in the flowchart(s) and/or block diagram block(s).

The one or more computer-executable program code portions may also be loaded onto a computer and/or other programmable data processing apparatus to cause a series of operational steps to be performed on the computer and/or other programmable apparatus. In some embodiments, this produces a computer-implemented process such that the one or more computer-executable program code portions which execute on the computer and/or other programmable apparatus provide operational steps to implement the steps specified in the flowchart(s) and/or the functions specified in the block diagram block(s). Alternatively, computer-implemented steps may be combined with, and/or replaced with, operator- and/or human-implemented steps in order to carry out an embodiment of the present invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations, modifications, and combinations of the just described embodiments can be configured without departing from the scope and spirit of the invention. Therefore, it is to be understood that, within the scope of the appended claims, the invention may be practiced other than as specifically described herein.

What is claimed is:

1. A microphone system comprising:
   a microphone circuit comprising:

a first transistor, wherein a gate terminal of the first transistor is connected to a ground terminal via a microphone electret element, the microphone electret element being associated with a capacitance and a voltage, the microphone electret element reverse biasing the first transistor; and a second transistor in parallel with the first transistor, wherein a gate terminal of the second transistor is connected to the ground terminal via a capacitor, the capacitance of the capacitor being selected to suppress at least a portion of a common mode signal, the common mode signal being at least a part of a voltage signal between a drain terminal of the first transistor and the ground terminal, and the gate terminal of the second transistor not being connected to the microphone electret element.

2. The microphone system of claim 1, wherein the capacitance of the second transistor is selected based at least partially on a bias voltage associated with at least one of the first transistor or the second transistor.

3. The microphone system of claim 1, wherein the capacitance of the second transistor is selected based at least partially on the voltage associated with the microphone electret element.

4. The microphone system of claim 1, wherein the capacitance of the second transistor is selected based at least partially on at least one characteristic associated with at least one of the first transistor, the second transistor, or the microphone electret element.

5. The microphone system of claim 1, wherein the first transistor and the second transistor are at least one of comprised in a single semiconductor package, selected from the same manufacturing batch, or are substantially similar.

6. The microphone system of claim 1, further comprising:
a housing that at least partially encloses a cavity and an electrode;
a movable membrane attached to the housing and configured to receive sound waves, the membrane and the electrode forming the microphone electret element, the sound waves causing the movable membrane to move thereby resulting in a change in the capacitance associated with the microphone electret element.

7. The microphone system of claim 1, wherein the microphone system is located in a portable mobile communication device.

8. The microphone system of claim 1, wherein an amount of current that flows through the first transistor is substantially similar to an amount of current that flows through the second transistor.

9. The microphone system of claim 1, wherein the second transistor is biased such that a substantially similar amount of current flows through both the first transistor and the second transistor.

10. The microphone system of claim 1, wherein the first transistor converts a higher impedance to a lower impedance.

11. The microphone system of claim 1, further comprising:
an amplifier that receives output from the first transistor as a first input and receives output from the second transistor as a second input.

12. The microphone system of claim 1, wherein a change in the capacitance associated with the microphone electret element changes an amount of current flowing through the first transistor.

13. The microphone system of claim 1, wherein the second transistor is configured to produce a reference voltage that is substantially constant both when the microphone system receives sound waves and when the microphone system does not receive sound waves.

14. The microphone system of claim 13, wherein the reference voltage is substantially equal to a voltage across the first transistor.

15. The microphone system of claim 1, wherein sound waves output by a speaker system are received at the microphone system, and wherein the common mode signal is associated with the sound waves output by the speaker system that are received at the microphone system.

16. The microphone system of claim 15, wherein sound waves received at the microphone system comprise at least one of sound waves associated with a user's speech or at least one of a delayed or filtered version of the sound waves output by the speaker system.

17. The microphone system of claim 15, wherein the speaker system and the microphone system are part of a single device.

18. The microphone system of claim 15, wherein the sound waves output by the speaker system comprise sound waves associated with a far-end talker, wherein the far-end talker uses a communication device to communicate with a user of the microphone system.

19. The microphone system of claim 15, wherein at least one of:
the microphone system, using output associated with the second transistor, creates at least one of a delayed or filtered version of the sound waves output by the speaker system,
the microphone system, using output associated with the second transistor, reduces a magnitude of the sound waves output by the speaker system that are received at the microphone system, or
the microphone system increases a magnitude of sound waves associated with a user's speech that are received at the microphone system.

20. A method for suppressing echo in a microphone system, the method comprising:
providing a first transistor, wherein a gate terminal of the first transistor is connected to a ground terminal via a microphone electret element, the microphone electret element being associated with a capacitance and a voltage, the microphone electret element reverse biasing the first transistor;
providing a second transistor in parallel with the first transistor, wherein a gate terminal of the second transistor is connected to the ground terminal via a capacitor, and wherein the gate terminal of the second transistor is not connected to the microphone electret element; and
determining a capacitance for the capacitor to substantially optimize an amount of suppression of a common mode signal, the common mode signal comprising an echo, and the common mode signal being at least a part of a signal between a drain terminal of the first transistor and the ground terminal.

* * * * *